(12) United States Patent
Giri et al.

(10) Patent No.: US 10,345,412 B2
(45) Date of Patent: Jul. 9, 2019

(54) RF PULSE GENERATION FOR MAGNETIC RESONANCE IMAGING

(71) Applicant: Siemens Healthcare GmbH, Erlangen OT (DE)

(72) Inventors: Shivraman Giri, Chicago, IL (US); Kieran O'Brien, High Gate Hill (AU)

(73) Assignee: Siemens Healthcare GmbH, Erlangen (DE)

( * ) Notice: Subject to any disclaimer, the term of this patent is extended or adjusted under 35 U.S.C. 154(b) by 486 days.

(21) Appl. No.: 14/884,807

(22) Filed: Oct. 16, 2015

(65) Prior Publication Data

US 2016/0124060 A1 May 5, 2016

Related U.S. Application Data

(60) Provisional application No. 62/074,719, filed on Nov. 4, 2014.

(51) Int. Cl.
*G01R 33/54* (2006.01)

(52) U.S. Cl.
CPC .......... *G01R 33/543* (2013.01); *G01R 33/546* (2013.01)

(58) Field of Classification Search
CPC .................. G01R 33/5602; G01R 33/5608
See application file for complete search history.

(56) References Cited

U.S. PATENT DOCUMENTS

| 6,448,769 | B1 | 9/2002 | Rosenfeld et al. | |
|---|---|---|---|---|
| 8,473,536 | B2 | 6/2013 | Balchandani et al. | |
| 2008/0238425 | A1* | 10/2008 | Xu | G01R 33/4833 324/322 |
| 2008/0265886 | A1* | 10/2008 | Green | G01R 33/5613 324/313 |
| 2011/0144474 | A1 | 6/2011 | Ouwerkerk | |
| 2011/0215807 | A1* | 9/2011 | Misic | G01R 33/341 324/322 |
| 2012/0032677 | A1* | 2/2012 | Dannels | G01R 33/5659 324/309 |

OTHER PUBLICATIONS

Ordidge, Roger J., et al. "Frequency offset corrected inversion (FOCI) pulses for use in localized spectroscopy." Magnetic resonance in medicine 36.4 (1996): 562-566.
(Continued)

*Primary Examiner* — Son T Le
*Assistant Examiner* — Dustin R Dickinson (57) ABSTRACT

An imaging system includes determination of a first range of values of an imaging parameter, determination of a cost function expressing a difference between a first pulse profile and a second pulse profile, the second pulse profile generated based on respective values of each of a set of pulse parameters, identification of first coefficient values of each function of a set of functions which substantially minimize the cost function over the first range of values of the imaging parameter, where each of the set of functions determines a value of a respective one of the set of pulse parameters based on a value of the imaging parameter, and storage of the first coefficient values of each function of the set of functions in association with the first range of values.

17 Claims, 7 Drawing Sheets

(56) References Cited

OTHER PUBLICATIONS

O'Brien, et al., "Whole Brain Pulsed Arterial Spin Labelling at Ultra High Field with a B1+-optimised Adiabatic Labelling Pulse", ISMRM 23rd Annual Meeting & Exhibition • May 30-Jun. 5, 2015 • Toronto, Ontario, Canada, 3985.
Questions and Answers in MRI, "Adiabatic excitation", http://mri-q.com/adiabatic-excitation.html, printed Aug. 27, 2015, 2 pages.
Questions and Answers in MRI, "Adiabatic NMR pulses", http://mri-q.com/adiabatic-pulses.html, printed Aug. 27, 2015, 2 pages.
Norris, David G., "Adiabatic Radiofrequency Pulse Forms in Biomedical Nuclear Magnetic Resonance", Concepts in Magnetic Resonance, vol. 14(2) 89-101 (2002).
DeGraaf, et al., "Adiabatic rf Pulses: Applications to In Vivo NMR", Concepts in Magnetic Resonance, vol. 9(4) 247-268 (1997).
Hurley, et al., "Tailored RF Pulse for Magnetization Inversion at Ultrahigh Field", Magnetic Resonance in Medicine 63:51-58 (2010).
Garwood, et al., "Advances in Magnetic Resonance—The Return of the Frequency Sweep: Designing Adiabatic Pulses for Contemporary NMR", Journal of Magnetic Resonance 153, 155-177 (2001).
Tannus, et al., "Adiabatic Pulses", NMR in Biomedicine, vol. 10, 423-434 (1997).

* cited by examiner

FIG. 4 — Table 26

| Family_Id | Slice range | Duration | Type |
|---|---|---|---|
| C4503 | 10-80nm | 13ms | C-FOCI |
| TR3722 | 10-80nm | 13ms | TR-FOCI |
| C3309 | 20-50nm | 8ms | C-FOCI |
| TR320 | 1-100nm | 8ms | TR-FOCI |

*FIG. 4*

FIG. 5 — Table 27A

| Family_Id | $A_{max}$ | $\mu$ | $\beta$ |
|---|---|---|---|
| C4503 | $m_{1a}, c_{1a}$ | $m_{2a}, c_{2a}$ | $m_{3a}, c_{3a}$ |
| C3309 | $m_{1b}, c_{1b}$ | $m_{2b}, c_{2b}$ | $m_{3b}, c_{3b}$ |
|  |  |  |  |

*FIG. 5*

FIG. 6 — Table 27B

| Family_Id | $A_{max}$ | $w$ | $r_1$ | $r_2$ | $r_3$ | $r_4$ | $r_5$ | $\mu$ | $\beta$ | $T_1$ | $T_2$ |
|---|---|---|---|---|---|---|---|---|---|---|---|
| TR3722 | $m_{1x}, c_{1x}$ | $m_{2x}, c_{2x}$ | $m_{3x}, c_{3x}$ | $m_{4x}, c_{4x}$ | $m_{5x}, c_{5x}$ | $m_{6x}, c_{6x}$ | $m_{7x}, c_{7x}$ | $m_{8x}, c_{8x}$ | $m_{9x}, c_{9x}$ | $m_{10x}, c_{10x}$ | $m_{11x}, c_{11x}$ |
| TR320 | $m_{1y}, c_{1y}$ | $m_{2y}, c_{2y}$ | $m_{3y}, c_{3y}$ | $m_{4y}, c_{4y}$ | $m_{5y}, c_{5y}$ | $m_{6y}, c_{6y}$ | $m_{7y}, c_{7y}$ | $m_{8y}, c_{8y}$ | $m_{9y}, c_{9y}$ | $m_{10y}, c_{10y}$ | $m_{11y}, c_{11y}$ |
|  |  |  |  |  |  |  |  |  |  |  |  |

RF PULSE GENERATION FOR MAGNETIC RESONANCE IMAGING

CROSS REFERENCE TO RELATED APPLICATIONS

This application is related to, and claims benefit to and priority of, U.S. Patent Application Ser. No. 62/074,719, filed on Nov. 4, 2014, the contents of which are hereby incorporated by reference in their entirety for all purposes.

BACKGROUND

Magnetic resonance imaging (MRI) uses the nuclear magnetic resonance (NMR) phenomenon to produce images of patient anatomy. According to MRI techniques, a substance (e.g., human tissue) is subjected to a main polarizing magnetic field, causing the individual magnetic moments of the nuclear spins in the tissue to process about the polarizing field in random order at their characteristic Larmor frequency, in an attempt to align with the field. A net magnetic moment $M_z$ is produced in the direction of the polarizing field, and the randomly-oriented magnetic components in the perpendicular plane (the x-y plane) cancel out one another.

The substance is then subjected to an excitation field (e.g., created by emission of a radiofrequency (RF) pulse) which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated and signals are emitted by the excited spins as they return to their pre-excitation field state. The emitted signals are detected, digitized and processed to reconstruct an image using one of many well-known MR reconstruction techniques.

An RF pulse may be emitted as a magnetization preparation step in order to enhance or suppress signals from certain tissue so as to generate desired levels of contrast in the resulting image. For example, an inversion, or saturation, pulse is used in non-contrast-enhanced angiography to suppress venous blood in order to highlight the arterial system.

Systems providing high main magnetic field strengths are increasingly available, with the promise of obtaining images exhibiting ever-higher resolution or Signal-to-Noise ratios. However, emitted RF fields are substantially inhomogeneous at high main magnetic field strengths due to, for example, RF penetration issues and RF coil design issues. The effectiveness of standard RF pulses to selectively enhance or suppress signals is therefore compromised at higher main magnetic field strengths, resulting in degraded image contrast and quality.

In order to address this inhomogeneity, standard RF pulses are conventionally replaced with adiabatic equivalents, such as the hyperbolic secant inversion pulse. Alternative adiabatic equivalents include numerically-optimized adiabatic pulses such as frequency offset corrected inversion (FOCI) pulses, which provide improved slice profiles and tissue suppression at lower RF amplitudes. Unfortunately, the adiabatic performance of an adiabatic pulse is sensitive to changes in its defining pulse parameters such as duration, frequency sweep, slice thickness, etc. Accordingly, an adiabatic pulse which has been numerically-optimized with respect to particular pulse parameters may not function as intended if one or more of those parameters is changed.

DETAILED DESCRIPTION

The following description is provided to enable any person in the art to make and use the described embodiments. Various modifications, however, will remain readily apparent to those in the art.

Figure 1:
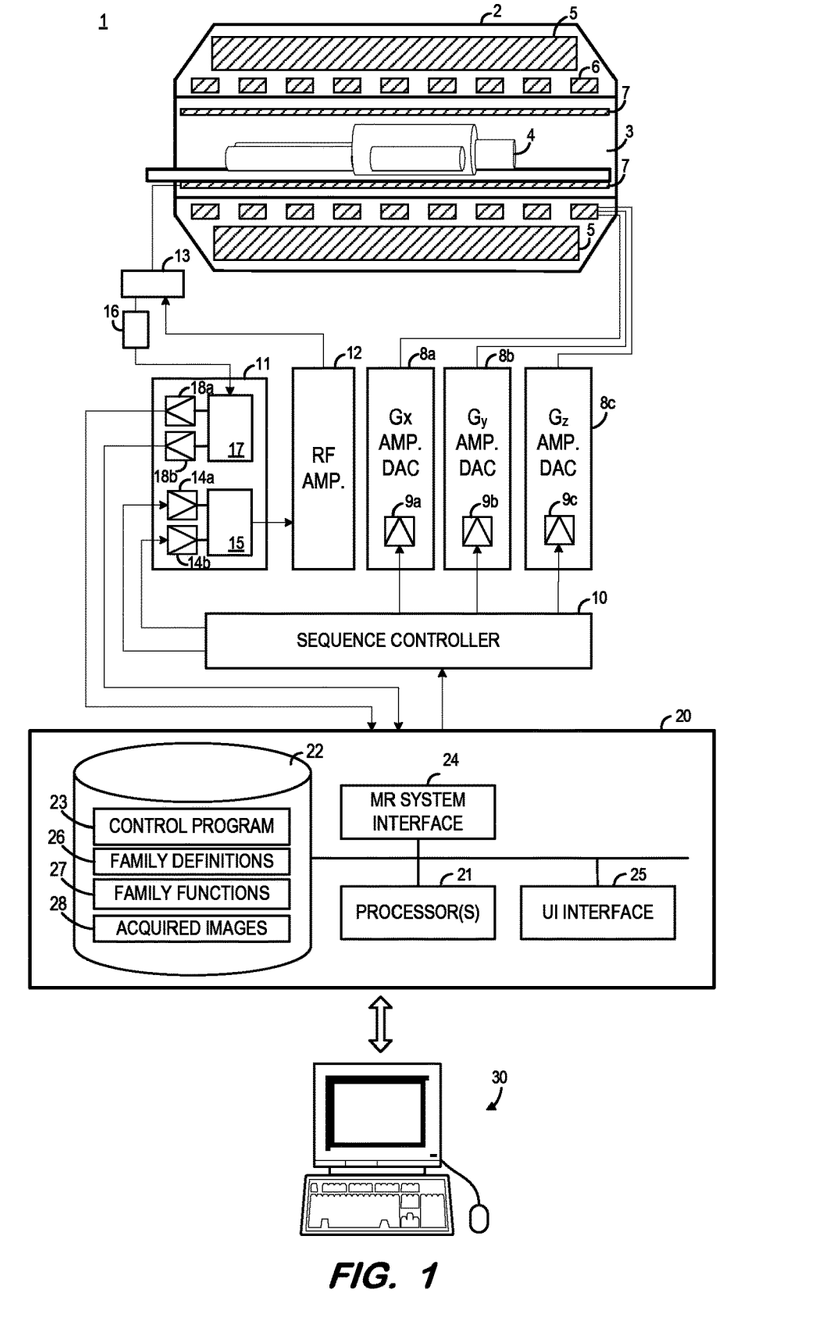
FIG. 1 is a block diagram of an MRI system according to some embodiments.

FIG. 1 illustrates MRI system 1 according to some embodiments. MRI system 1 includes MRI chassis 2, which defines bore 3 in which patient 4 is disposed. MRI chassis 2 includes polarizing main magnet 5, gradient coils 6 and RF coil 7 arranged about bore 3. According to some embodiments, polarizing main magnet 5 generates the uniform main magnetic field ($B_0$) mentioned above and RF coil 7 emits the excitation field ($B_1$).

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11. RF system 11 is responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses to be produced by RF system 11 are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of processing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18*a* and 18*b* convert the demodulated signals into a real part and an imaginary part.

Computing system 20 receives the real and imaginary parts and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random access memory, and/or removable media (e.g., a thumb drive) mounted in a corresponding interface (e.g., a USB port).

Storage device 22 stores program code of control program 23. One or more processing units 21 may execute control program 23 to cause system 20 to perform any one or more of the processes described herein. For example, one or more processing units 21 may execute control program 23 to cause system 20 to determine parameter functions of a pulse family and/or to generate an RF pulse based on the functions of a pulse family as described herein. Family definitions 26 may define pulse families based on values of particular pulse parameters and family functions 27 may specify, for each of a plurality of pulse families, pulse parameter function coefficients. Family definitions 26 and family functions 27 will be described in further detail below.

One or more processing units 21 may execute control program 23 to cause system 20 to receive the real and imaginary parts of a received RF signal via MR system interface 24 and reconstruct an image therefrom according to known techniques. Such an image may be stored among acquired images 28 of storage device 22.

One or more processing units 21 may also execute control program 23 to provide instructions to sequence controller 10 via MR system interface 24. For example, sequence controller 10 may be instructed to initiate the desired pulse sequences and corresponding scanning. In particular, sequence controller 10 may be instructed to control the switching of magnetic field gradients via amplifiers 8*a*-8*c* at appropriate times, the transmission of radio-frequency pulses having a specified phase and amplitude at specified times via RF system 11 and RF amplifier 12, and the reception of the resulting magnetic resonance signals.

Acquired images 28 may be provided to terminal 30 via UI interface 25 of system 20. UI interface 25 may also receive input from terminal 30, which may be used to provide commands to control program 23 in order to control sequence controller 10 and/or other elements of system 1. The commands may specify pulse parameter values which are used by system 20 to determine a corresponding pulse family. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Figure 2:
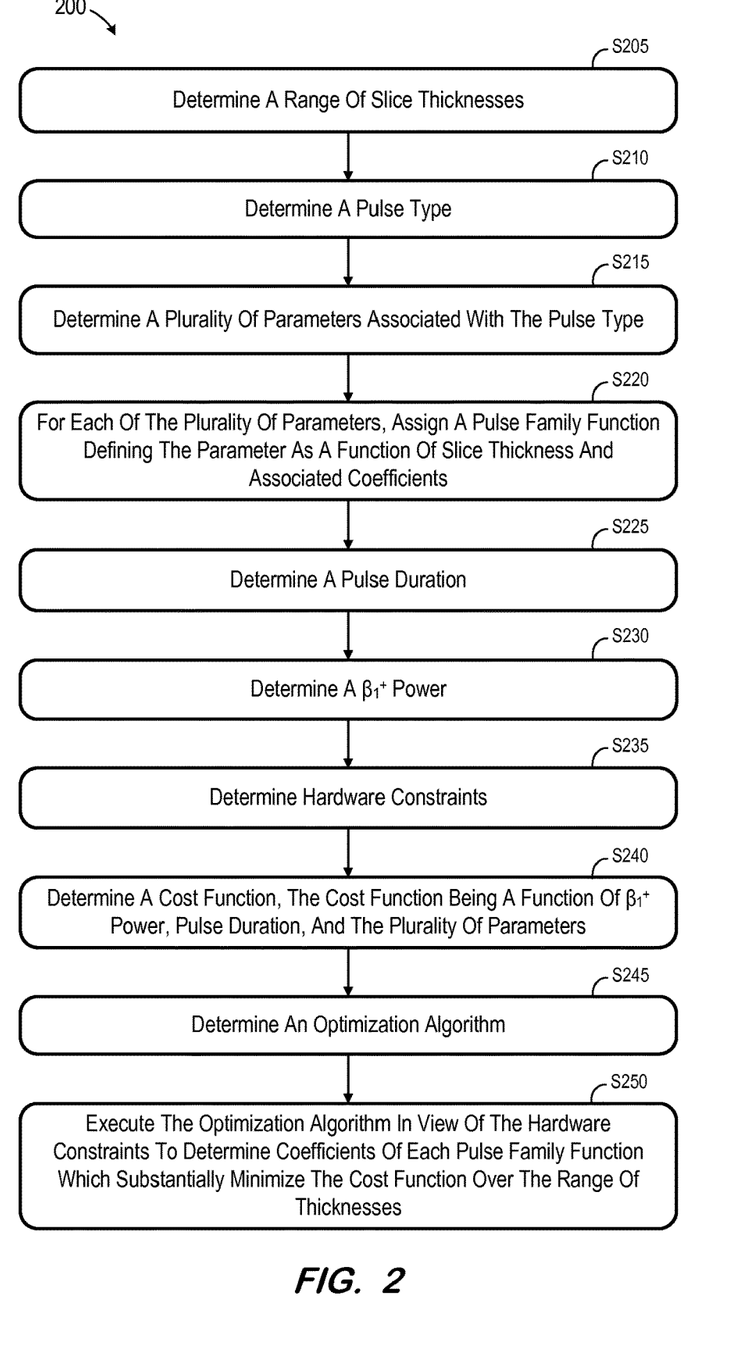
FIG. 2 is a flow diagram of a process to determine functions of a pulse family according to some embodiments.

FIG. 2 is a flowchart of process 200 according to some embodiments. Process 200 may be executed in some embodiments to determine a function for each parameter of an adiabatic pulse. Each of the determined functions is a function of another imaging parameter (e.g., slice thickness). The determined functions may be used to efficiently provide values for each parameter of an effective adiabatic pulse based on the other imaging parameter, across a range of values of the other imaging parameter.

In some embodiments, various hardware elements of system 1 (e.g., one or more processors) execute program code to perform process 200. Process 200 and all other processes mentioned herein may be embodied in processor-executable program code read from one or more of non-transitory computer-readable media, such as a floppy disk, a disk-based or solid-state hard drive, CD-ROM, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at S205, a range of slice thicknesses is determined. The range of slice thicknesses is a range for which a pulse family of functions will be determined. In other words, the determined functions of the pulse family will be applicable to any slice thickness within the range. For example, in some embodiments, an operator of terminal 30 may manipulate a displayed graphical interface to select a range of slice thicknesses of 30 to 100 mm. In this regard, processor(s) 21 may execute control program 23 to provide such a user interface and to execute process 200.

Embodiments are not limited to determination of a range of slice thicknesses. Some embodiments may alternatively determine a range of pulse durations, or a range of another imaging parameter, at S210. In the former instance, the plurality of functions determined according to process 200 may be used to determine values of each pulse parameter of an adiabatic pulse based on a particular pulse duration, across the specified range of pulse durations.

A pulse type is determined at S210. The determined pulse type may be any type of adiabatic pulse defined by a discrete set of a plurality of parameters. The plurality of parameters for the selected pulse type are further determined at S215. For example, a C-shape frequency offset-corrected conversion (C-FOCI) pulse is a known adiabatic pulse and is defined by three parameters: $A_{max}$, $\mu$, and $\beta$. The time-resampled frequency offset-corrected conversion (TR-FOCI) pulse is defined by eleven parameters: $A_{max}$, w, $r_1$, $r_2$, $r_3$, $r_4$, $r_5$, $\mu$, $\beta$, $T_1$, $T_2$. Any other pulse types that are or become known may be determined at S210. As described above, the pulse type may be selected by an operator of terminal 30 at S210.

Next, at S220, a pulse family function is assigned to each of the plurality of parameters. For a given parameter, a pulse family function defines the parameter as a function of slice thickness and associated coefficients. In some embodiments, for example, the pulse family functions are linear functions. Accordingly, assuming that the determined pulse type is C-FOCI, the following pulse family functions may be assigned at S220, where x represents slice thickness:

$$A_{max} = m_1 x + c_1$$

$$\mu = m_2 x + c_2$$

$$\beta = m_3 x + c_3$$

The pulse family functions may be functions of any degree according to some embodiments. Accordingly, assuming that the determined pulse type is TR-FOCI, the following quadratic pulse family functions may be assigned at S220, where again x represents slice thickness:

$$A_{max} = a_1 x^2 + b_1 x + c_1$$

$$w = a_2 x^2 + b_2 x + c_2$$

$$r_1 = a_3 x^2 + b_3 x + c_3$$

$$r_2 = a_4 x^2 + b_4 x + c_4$$

$$r_3 = a_5 x^2 + b_5 x + c_5$$

$$r_4 = a_6 x^2 + b_6 x + c_6$$

$$r_5 = a_7 x^2 + b_7 x + c_7$$

$$\mu = a_8 x^2 + b_8 x + c_8$$

$$\beta = a_9 x^2 + b_9 x + c_9$$

$$T_1 = a_{10} x^2 + b_{10} x + c_{10}$$

$$T_2 = a_{11} x^2 + b_{11} x + c_{11}$$

Each pulse family function may therefore be represented by a set of coefficients. In the first example above, the pulse family function assigned to the $A_{max}$ parameter may be represented by $a_1$, $b_1$. Embodiments are not limited to pulse family functions of a same degree or to polynomial functions. For example, one parameter may be assigned to a linear pulse family function, while another parameter may be assigned to a cubic pulse family function, while another parameter may be assigned to a power law family function.

A pulse duration and a $\beta_1^+$ power are determined at S225 and S230, respectively. In one example, the pulse duration may be specified as 13 ms and the $\beta_1^+$ power as 5 µT. These values may be input by an operator as described above.

Next, at S235, hardware constraints are determined. The hardware constraints may mathematically represent physical limits of system 1 (e.g., maximum gradient and slew rate, maximum frequency sweep (Amax*µ*β), etc.), or any other constraint on the optimization algorithm to be described below. Hardware constraints may be hard-coded into system 20 and therefore known during execution of process 200 and/or may be received from an operator of terminal 30.

Figure 3:
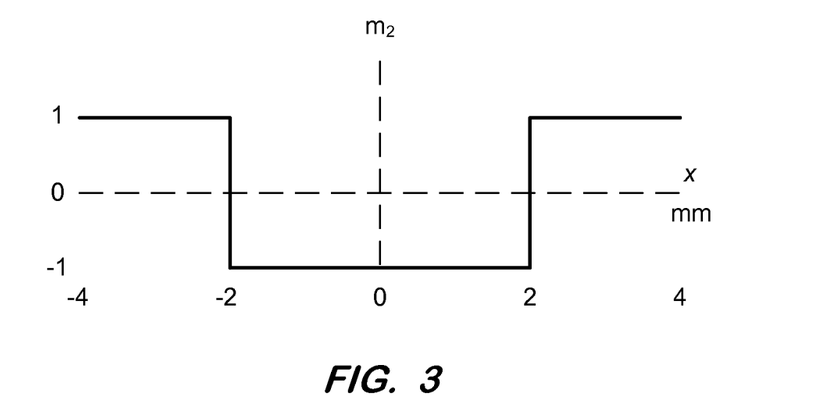
FIG. 3 illustrates a cost function according to some embodiments.

A cost, or loss, function is determined at S240. The cost function is a function that subsequent optimization of the pulse family functions will attempt to minimize. FIG. 3 illustrates an ideal profile of an adiabatic pulse to be generated in some embodiments. Accordingly, the cost function determined at S240 may calculate a difference between the FIG. 3 profile and the actual profile of pulses generated based on the pulse family of functions over the range of thicknesses. Since the actual profile is based on the pulse duration, the $\beta_1^+$ power and the plurality of family functions, the determined cost function is a function of each of these factors.

For example, equations (1) and (2) describe a cost function (e.g., an Inversion Profile Accuracy (IPA) function) for one pulse, where I(i) represents the FIG. 3 profile and V(i) is a simulated profile generated by, for example, a Bloch equation simulator. The IPA function can be determined against a range of $\beta_1^+$ amplitudes. If this is the case, then a weighting function such as Equation (2) can be used to favor certain $\beta_1^+$ pulses. Equation (3) sums the one pulse cost function over the range of slice thicknesses, where various thicknesses may be assigned weights per $\alpha_x$. Equation (4) is in a more general form which combines (2) and (3).

$$(1) \quad IPA_x(B_1) = \frac{2N}{\sum_{i=N}^{-N}(I(i) - V(i))^2}$$

$$(2) \quad WIPA = \sum_{j=1}^{3} IPA(B_{ij}) \alpha_j$$

$$(3) \quad \sum_x WIPA(x) \alpha_x$$

$$(alt) \quad WIPA = \sum_x \sum_j IPA_x(B_j) \alpha_{j,x}$$

An optimization algorithm is determined at S245. Generally, an optimization algorithm is a procedure which is executed iteratively by comparing various solutions until an optimum or a satisfactory solution is found. In this instance, the determined optimization algorithm is intended to determine coefficients for each pulse family function (e.g., $m_{1-3}$, $c_{1-3}$) which minimize the cost function over the range of slice thicknesses, and in view of the pulse duration, pulse power and hardware constraints. Examples, of a suitable optimization algorithm include heuristic optimization algorithms such as a genetic algorithm, but are not limited thereto. The optimization algorithm is executed at S250 to determine the coefficients.

Figure 4:
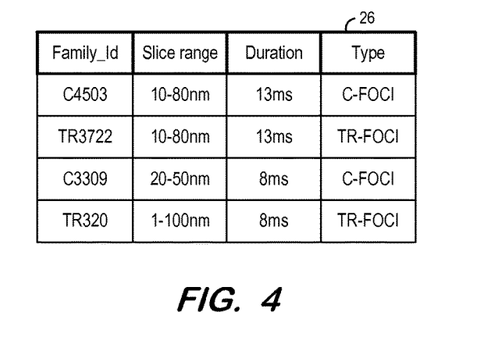
FIG. 4 is a tabular representation of a pulse family definition data table according to some embodiments.
Figure 5:
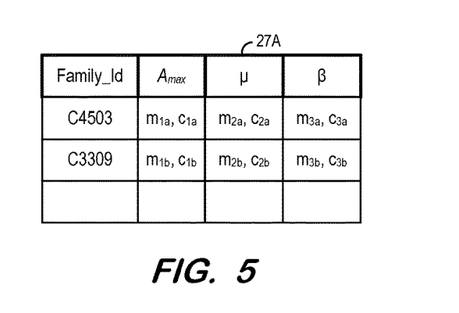
FIG. 5 is a tabular representation of a pulse family functions data table according to some embodiments.
Figure 6:
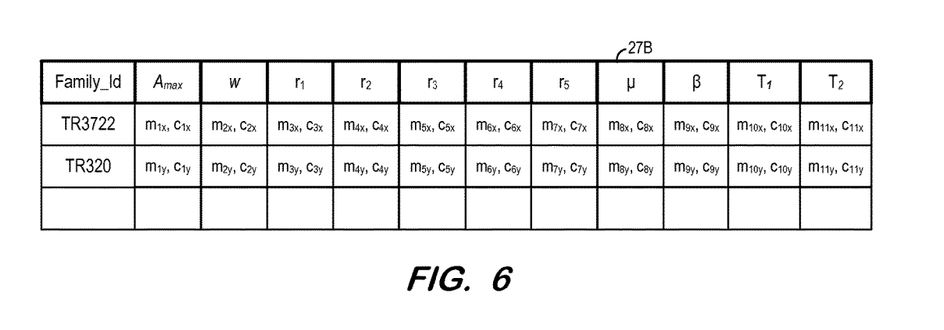
FIG. 6 is a tabular representation of a pulse family functions data table according to some embodiments.

FIGS. 4 through 6 are tabular representations of data tables which may be populated according to some embodiments of process 200. For example, FIG. 4 illustrates family definitions table 26. Table 26 associates a Family_id with a range of slice thicknesses (i.e., Slice Range), a pulse duration (i.e., Duration) and a pulse type (i.e., Type). A Family_Id identifies a set of pulse family functions which have been generated in view of the associated slice thicknesses, pulse duration and pulse type. Other characteristics, including but not limited to pulse power and hardware constraints, may also be associated with each Family_Id in some embodiments.

Tables 27A and 27B of FIGS. 5 and 6 define functions of each of several pulse families. Specifically, tables 27A and 27B specify the coefficients of each function in a given pulse family. Table 27A is associated with C-FOCI pulse families and therefore stores coefficients of linear functions for each of three parameters per pulse family. Although the coefficients are symbolically represented in FIG. 5 for clarity, actual values of the coefficients are stored. These coefficients may be determined according to process 200.

Similarly, table 27B is associated with TR-FOCI pulse families and therefore stores actual coefficients of linear functions for each of eleven parameters per pulse family. Any types of pulses associated with any number of pulse parameters may be used in some embodiments, and therefore a function family may include any number of functions.

Figure 7:
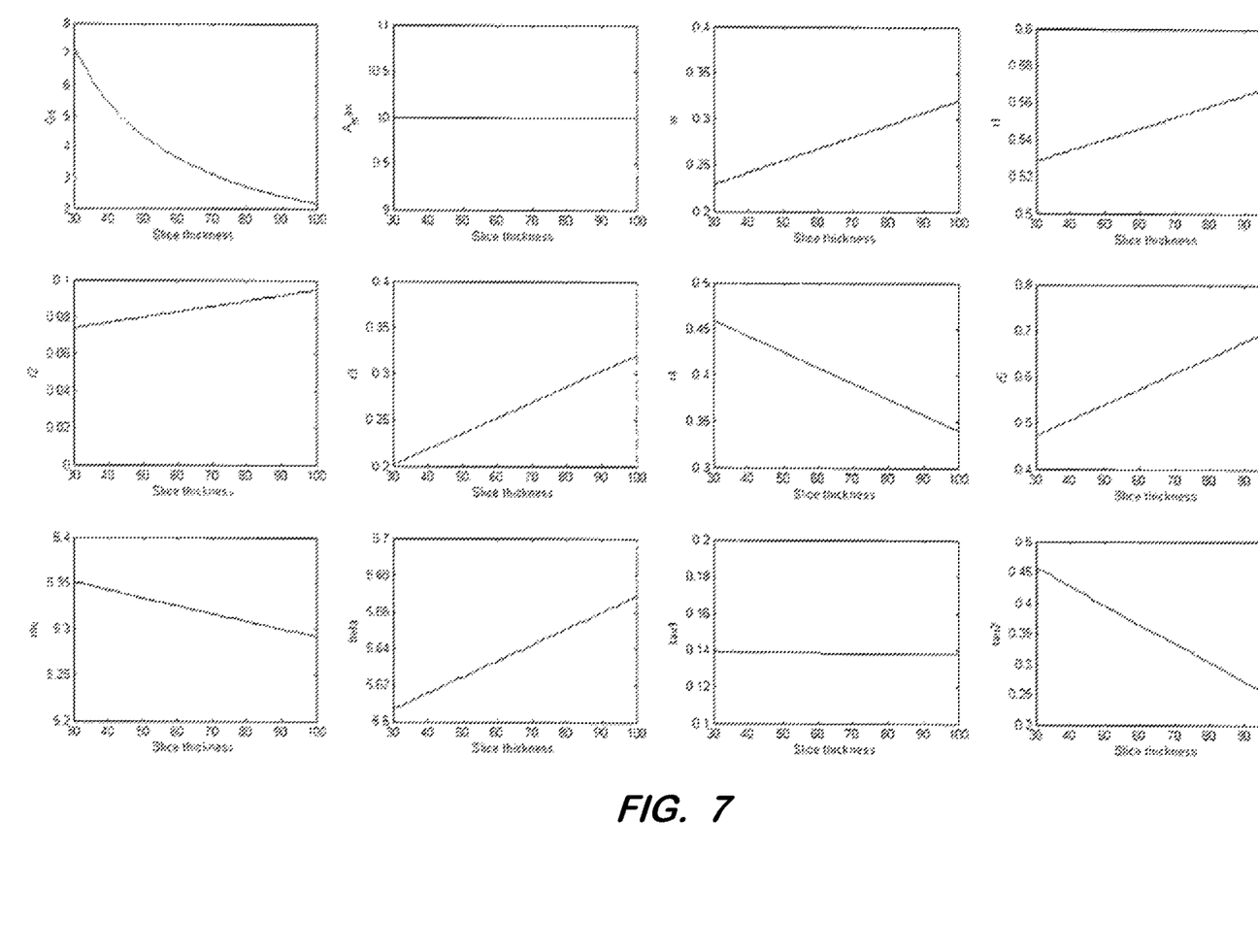
FIG. 7 illustrates linear functions of a pulse family according to some embodiments.

FIG. 7 illustrates linear functions for each of the eleven TR-FOCI pulse parameters according to some embodiments. Each function allows determination of a pulse parameter value for a given value of slice thickness between 30 nm and 100 nm. As shown in the upper left of FIG. 7, the use of linear functions results in a higher-order dependence of the slice-select gradient ($G_s$) than the linear dependence which is expected if one uses fixed pulse parameters or, alternatively, a random allocation of parameters based on simple bounded optimization in view of a single slice thickness.

Figure 8:
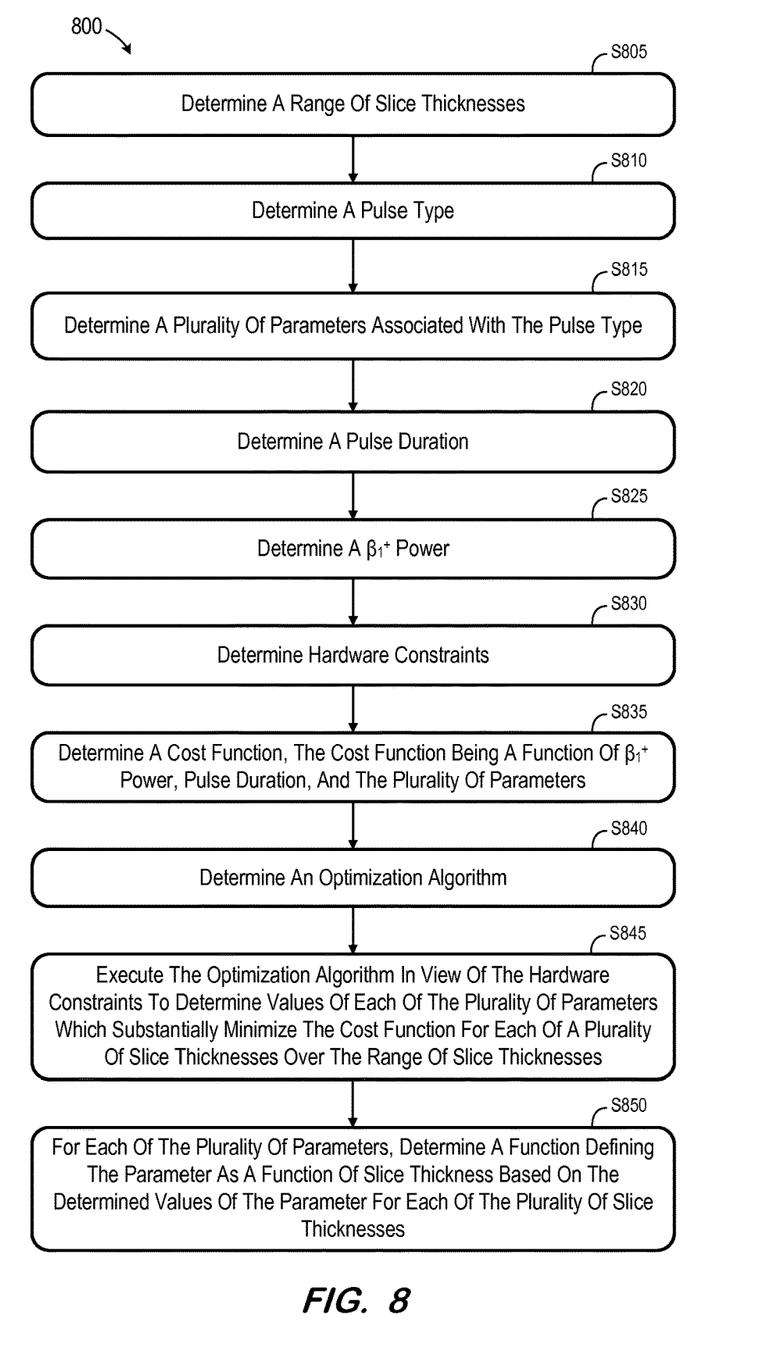
FIG. 8 is a flow diagram of a process to determine functions of a pulse family according to some embodiments.

FIG. 8 is a flow diagram of process 800 according to some embodiments. Process 800 describes an "indirect" system for determining a set of pulse family functions according to some embodiments.

S805 through S840 proceed similarly to S205 through S240 of FIG. 2. At S845, the determined optimization algorithm is executed in view of the determined hardware constraints to determine values of each of the plurality of parameters. The determined values are those which minimize the determined cost function for each of a plurality of slice thicknesses, over the range of specified slice thicknesses. Accordingly, the result of S845 will be a set of coordinates ($p_{ix}$, x) for each parameter $p_i$, where $p_{ix}$ is a value of the parameter which was determined at S845 for slice thickness x.

Next, at S850, and for each of the plurality of parameters, a function is determined which defines the parameter as a function of slice thickness, based on those values which were determined for the parameter at S845. S850 may therefore comprise determining a best fitting function (linear, quadratic or otherwise) for the set of coordinates of each of the plurality of parameters. The coefficients of such functions may then be stored in family functions table 27 as described above.

Figure 9:
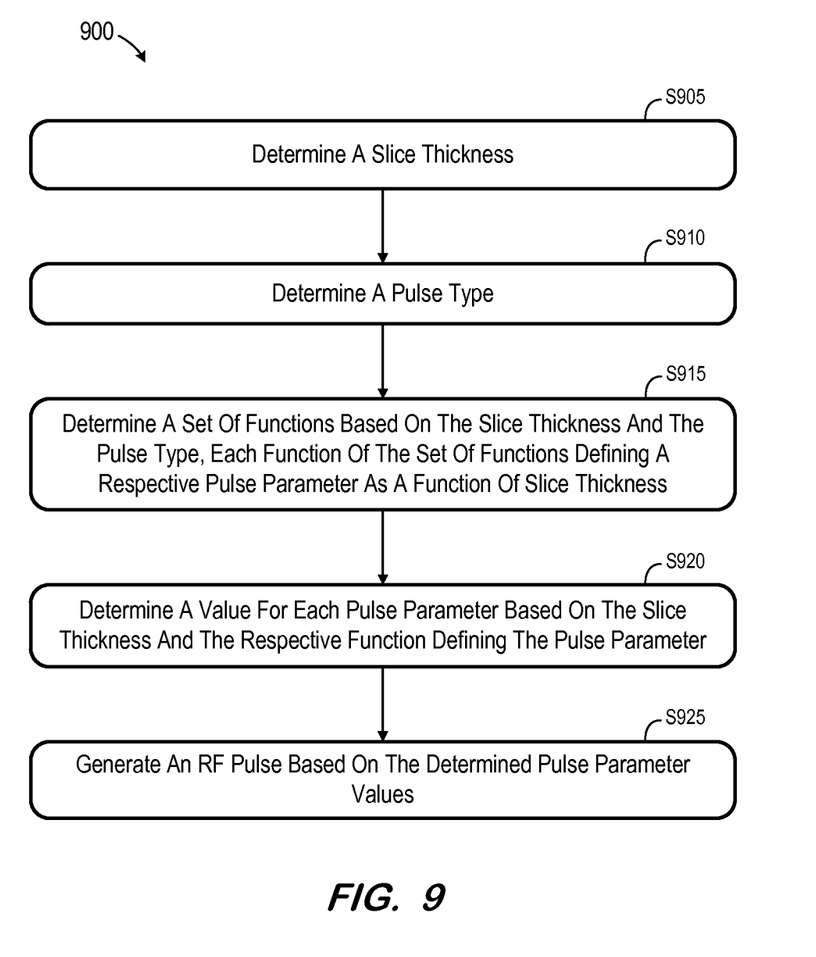
FIG. 9 is a flow diagram of a process to generate a pulse based on functions of a pulse family according to some embodiments.

FIG. 9 illustrates process 900 according to some embodiments. Process 900 may be used to generate and deliver an RF pulse based on the pulse family functions described above. Initially, at S905, a slice thickness is determined. An operator may determine a desired slice thickness of an image to be acquired and input the slice thickness to system 20, using a user interface provided thereby and displayed on terminal 30.

The user may similarly select a pulse type at S910. Although C-FOCI and TR-FOCI are explicitly considered herein, some embodiments may employ any other type of RF pulse associated with any number of parameters.

At S915, a set of functions is determined based on the slice thickness and the pulse type. Each function of the determined set defines a respective pulse parameter as a function of slice thickness. In one example, a slice thickness of 15 nm and a pulse type of C-FOCI are determined at S905 and S910. Turning to FIG. 4, it is determined that these values are associated with the Family_Id C4503. Accordingly, the set of functions determined at S915 are those associated with Family_Id C4503 in table 27A of FIG. 5. Specifically:

$$A_{max} = m_{1a}x + c_{1a}$$

$$\mu = m_{2a}x + c_{2a}$$

$$\beta = m_{3a}x + c_{3a}$$

where $m_{1a}$ through $m_{3a}$ and $c_{1a}$ through $c_{3a}$ are actual numeric values.

Next, at S920, a value is determined for each pulse parameter based on the slice thickness determined at S905. For example, the slice thickness "15" may simply be substituted for the variable x in the above equations to determine pulse values for each of $A_{max}$, $\mu$ and $\beta$. Finally, at S925, an RF pulse is generated based on the determined parameter values as is known in the art (e.g., by RF system 11 and RF amplifier 12 under control of sequence controller 10) and delivered within an MRI imaging sequence.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

All systems and processes discussed herein may be embodied in program code stored on one or more non-transitory computer-readable media. Such media may include, for example, a floppy disk, a CD-ROM, a DVD-ROM, a Flash drive, magnetic tape, and solid state Random Access Memory (RAM) or Read Only Memory (ROM) storage units. Embodiments are therefore not limited to any specific combination of hardware and software.

Embodiments described herein are solely for the purpose of illustration. Those in the art will recognize other embodiments may be practiced with modifications and alterations to that described above.

What is claimed is:

1. A system comprising:
   a chassis defining a bore;
   a main magnet to generate a polarizing magnetic field within the bore;
   a gradient system to apply a gradient magnetic field to the polarizing magnetic field;
   a radio frequency system to apply an excitation pulse to a patient tissue disposed within the bore and to receive signals from the patient tissue;
   a sequence controller to control generation of the excitation pulse by the radio frequency system; and
   a computing system to receive the signals from the radio frequency system, the computing system to execute program code to:
   determine a first range of values of an imaging parameter;
   determine a cost function expressing a difference between a first pulse profile and a second pulse profile, the second pulse profile generated based on respective values of each of a set of pulse parameters;
   identify first coefficient values of each function of a set of functions which substantially minimize the cost function over the first range of values of the imaging parameter, where each of the set of functions determines a value of a respective one of the set of pulse parameters based on a value of the imaging parameter;

store the first coefficient values of each function of the set of functions in association with the first range of values;

determine the value of the imaging parameter;

determine, for each function of the set of functions, a value of a pulse parameter based on the first coefficient values of the function and the value of the imaging parameter; and control the radio frequency system to generate a pulse based on the pulse parameter values.

2. A system according to claim 1, wherein the imaging parameter is slice thickness.

3. A system according to claim 1, the computing system to further execute program code to:

determine a second range of values of the imaging parameter;

identify second coefficient values of each function of the set of functions which substantially minimize the cost function over the second range of values of the imaging parameter; and store the second coefficient values of each function of the set of functions in association with the second range of values.

4. A system according to claim 1, the computing system to further execute program code to:

determine a type of radio frequency pulse; and determine the set of functions based on the type of radio frequency pulse.

5. A system according to claim 1, wherein the radio frequency system is responsive to a scan prescription and a direction from the sequence controller to produce the excitation pulse having a predetermined frequency, a predetermined phase, and a predetermined pulse amplitude waveform.

6. A system according to claim 1, further comprising:

a plurality of amplifiers, wherein each amplifier includes a digital-analog converter, and the digital-analog converter of each amplifier is controlled by the sequence controller to generate a gradient pulse.

7. A computer-implemented method comprising:

determining a first range of values of an imaging parameter for a MRI system;

determining a cost function expressing a difference between a first pulse profile and a second pulse profile, the second pulse profile generated based on respective values of each of a set of pulse parameters;

identifying first coefficient values of each function of a set of functions which substantially minimize the cost function over the first range of values of the imaging parameter, where each of the set of functions determines a value of a respective one of the set of pulse parameters based on a value of the imaging parameter;

storing the first coefficient values of each function of the set of functions in association with the first range of values in a memory;

determining a second range of values of the imaging parameter;

identifying second coefficient values of each function of the set of functions which substantially minimize the cost function over the second range of values of the imaging parameter;

storing the second coefficient values of each function of the set of functions in association with the second range of values;

determining the value of the imaging parameter;

determining whether the value of the imaging parameter is within the first range of values or within the second range of values;

if the value of the imaging parameter is within the first range of values, determining, for each function of the set of functions, a value of a pulse parameter based on the first coefficient values of the function and the value of the imaging parameter;

if the value of the imaging parameter is within the second range of values, determining, for each function of the set of functions, a value of a pulse parameter based on the second coefficient values of the function and the value of the imaging parameter; and controlling a radio frequency system to generate a pulse based on the pulse parameter values, wherein the MRI system further comprises:

a chassis defining a bore;

a main magnet to generate a polarizing magnetic field within the bore;

a gradient system to apply a gradient magnetic field to the polarizing magnetic field;

a radio frequency system to apply an excitation pulse to a patient tissue disposed within the bore and to receive signals from the patient tissue; and a sequence controller to control generation of the excitation pulse by the radio frequency system.

8. A method according to claim 7, wherein the imaging parameter is slice thickness.

9. A method according to claim 7, further comprising:

determining a type of radio frequency pulse; and determining the set of functions based on the type of radio frequency pulse.

10. A method according to claim 7, wherein the radio frequency system is responsive to a scan prescription and a direction from the sequence controller to produce the excitation pulse having a predetermined frequency, a predetermined phase, and a predetermined pulse amplitude waveform.

11. A method according to claim 7, further comprising:

a plurality of amplifiers, wherein each amplifier includes a digital-analog converter, and the digital-analog converter of each amplifier is controlled by the sequence controller to generate a gradient pulse.

12. A non-transitory computer-readable medium storing program code, the program code executable by a computer system to cause the computer system to:

determine a first range of values of an imaging parameter for a MRI system;

determine a cost function expressing a difference between a first pulse profile and a second pulse profile, the second pulse profile generated based on respective values of each of a set of pulse parameters;

identify first coefficient values of each function of a set of functions which substantially minimize the cost function over the first range of values of the imaging parameter, where each of the set of functions determines a value of a respective one of the set of pulse parameters based on a value of the imaging parameter;

store the first coefficient values of each function of the set of functions in association with the first range of values in a memory;

determine the value of the imaging parameter;

determine, for each function of the set of functions, a value of a pulse parameter based on the first coefficient values of the function and the value of the imaging parameter; and control a radio frequency system to generate a pulse based on the pulse parameter values, wherein the MRI system further comprises:
a chassis defining a bore;
a main magnet to generate a polarizing magnetic field within the bore;
a gradient system to apply a gradient magnetic field to the polarizing magnetic field;
a radio frequency system to apply an excitation pulse to a patient tissue disposed within the bore and to receive signals from the patient tissue; and
a sequence controller to control generation of the excitation pulse by the radio frequency system.

13. A medium according to claim 12, wherein the imaging parameter is slice thickness.

14. A medium according to claim 12, the program code further executable by a computer system to cause the computer system to:
determine a second range of values of the imaging parameter;
identify second coefficient values of each function of the set of functions which substantially minimize the cost function over the second range of values of the imaging parameter; and
store the second coefficient values of each function of the set of functions in association with the second range of values.

15. A medium according to claim 12, the program code further executable by a computer system to cause the computer system to:
determine a type of radio frequency pulse; and
determine the set of functions based on the type of radio frequency pulse.

16. A medium according to claim 12, wherein the radio frequency system is responsive to a scan prescription and a direction from the sequence controller to produce the excitation pulse having a predetermined frequency, a predetermined phase, and a predetermined pulse amplitude waveform.

17. A medium according to claim 12, further comprising:
a plurality of amplifiers, wherein each amplifier includes a digital-analog converter, and the digital-analog converter of each amplifier is controlled by the sequence controller to generate a gradient pulse.

* * * * *